United States Patent [19]

Scifres et al.

[11] Patent Number: 4,656,641
[45] Date of Patent: Apr. 7, 1987

[54] LASER CAVITY OPTICAL SYSTEM FOR STABILIZING THE BEAM FROM A PHASE LOCKED MULTI-EMITTER BROAD EMITTER LASER

[75] Inventors: Donald R. Scifres, Los Altos; Robert A. Sprague, Saratoga, both of Calif.

[73] Assignee: Xerox Corporation, Stamford, Conn.

[21] Appl. No.: 697,811

[22] Filed: Feb. 4, 1985

[51] Int. Cl.[4] ................................. H01S 3/08
[52] U.S. Cl. ........................ 372/103; 372/9; 372/99; 372/101; 350/420
[58] Field of Search .............. 372/108, 9, 101, 103, 372/99; 350/420, 433, 421

[56] References Cited

U.S. PATENT DOCUMENTS

| | | | |
|---|---|---|---|
| 3,701,044 | 10/1972 | Paoli et al. | 331/94.5 |
| 3,974,507 | 8/1976 | Chemelli et al. | 372/101 |
| 4,203,652 | 5/1980 | Hanada | 350/182 |
| 4,253,735 | 3/1981 | Kawamura et al. | 350/409 |
| 4,255,717 | 3/1981 | Scifres et al. | 331/94.5 |
| 4,318,594 | 3/1982 | Hanada | 350/433 |
| 4,323,297 | 4/1982 | Kawamura et al. | 350/6.8 |
| 4,530,574 | 7/1985 | Scifres et al. | 350/420 |

OTHER PUBLICATIONS

D. R. Scifres et al. "Phase-Locked Semiconductor Laser Array", Applied Physics Letters, vol. 33(12), pp. 1015-1017.

Primary Examiner—Leon Scott, Jr.
Attorney, Agent, or Firm—W. Douglas Carothers, Jr.

[57] ABSTRACT

A laser cavity optical system is provided for stabilizing the laser far field dominate lobe so that no beam shift occurs. The laser cavity optical system comprises a lens system positioned at one facet of a phased array semiconductor laser for imaging the near field pattern of the laser comprising a single beam waist position in a first spatial direction and reimaging the far field pattern in a second spatial direction after having first focused the far field pattern in the second spatial direction to a single beam waist position. The improvement in the laser cavity optical system comprises a partially reflecting, partially transmitting mirror located at the second spatial direction beam waist position to stabilize the laser beam and prevent laser beam shift at higher operating powers and operating temperatures. Feedback means provided in the system is capable of either spatially or angularly discriminating relative to far field lobes present in a portion of said reflected light output. The mirror may also be a wavelength selective filter. Further, a slit aperture may be located at the second spatial direction beam waist position to limit the angle of aperture of the beam and thereby cutoff second, less dominate lobes present in the far field. Means to control the wavelength of the emission from the laser, such as a grating, prism, or spectral filter, may be provided in an external optical cavity at the other laser facet to provide wavelength selective reflection.

29 Claims, 35 Drawing Figures

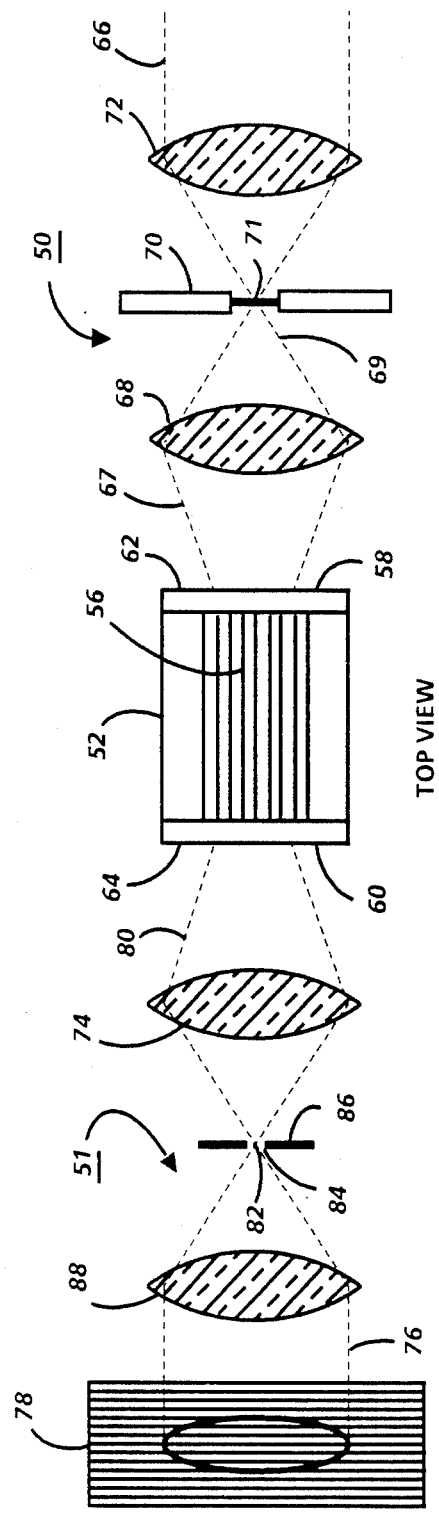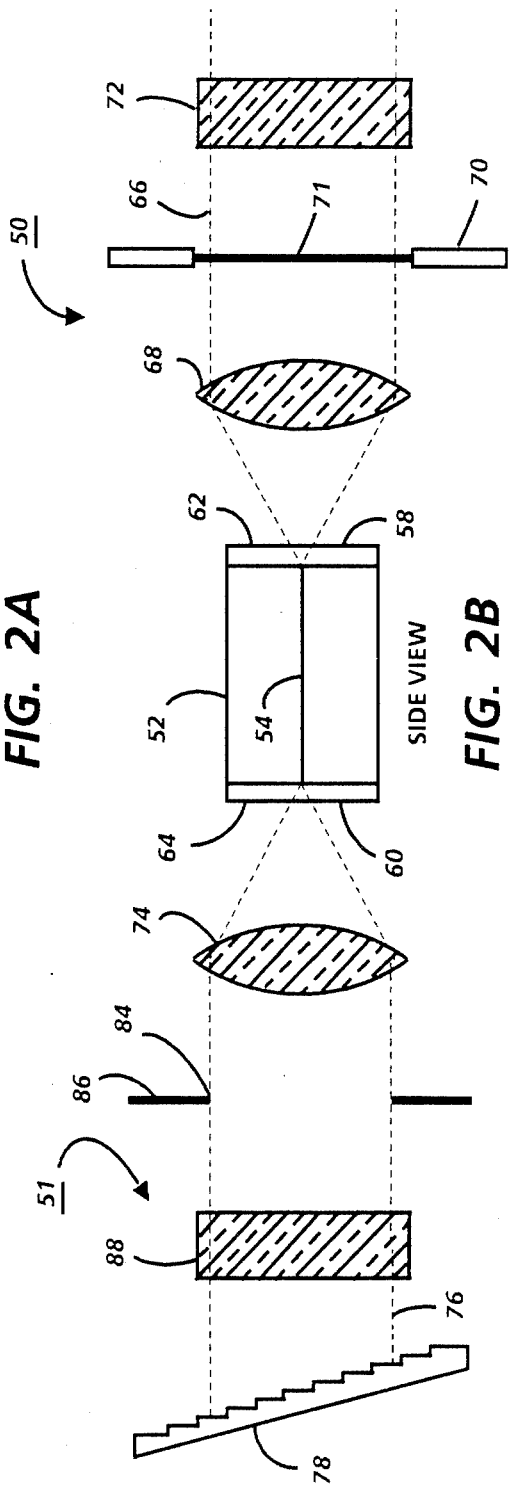
FIG. 2A TOP VIEW
FIG. 2B SIDE VIEW

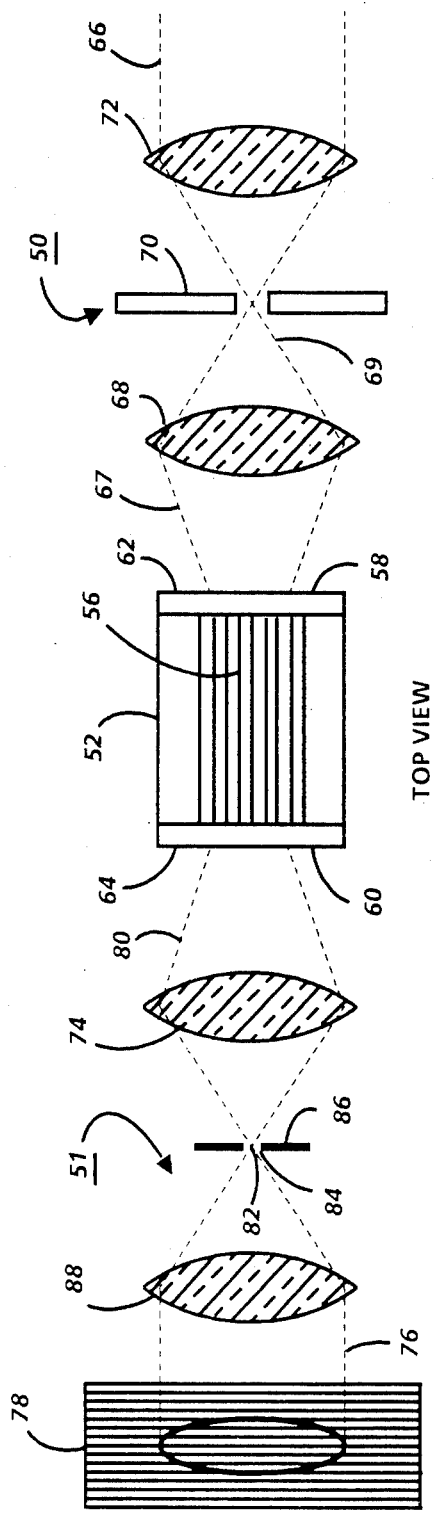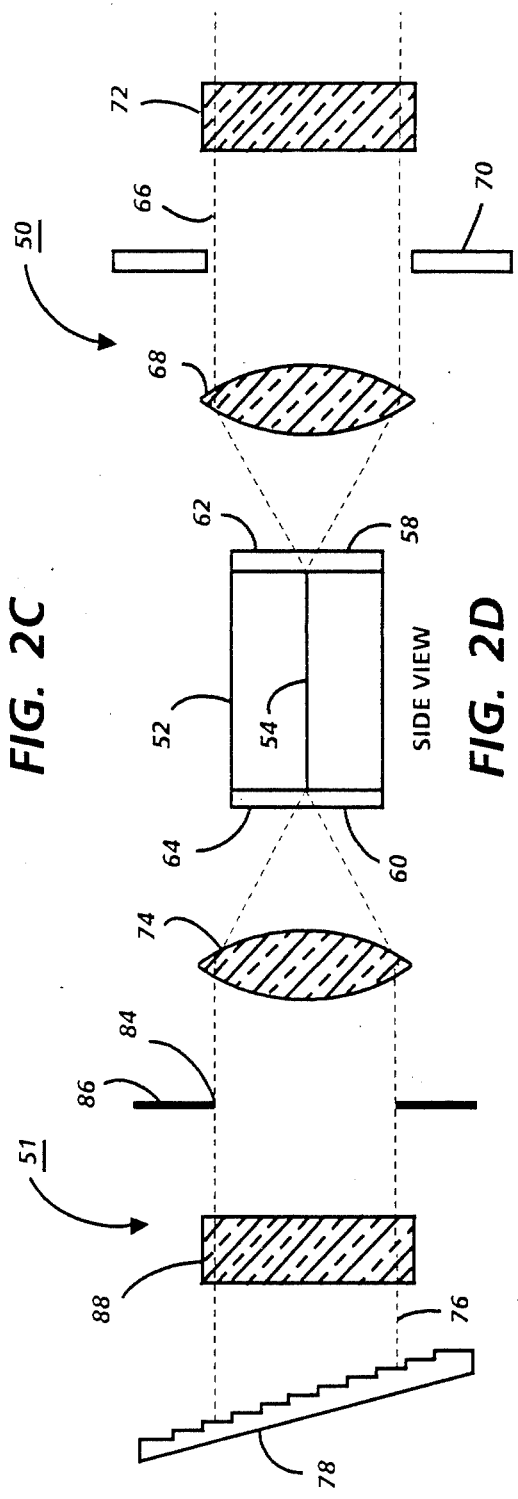
FIG. 2C TOP VIEW
FIG. 2D SIDE VIEW

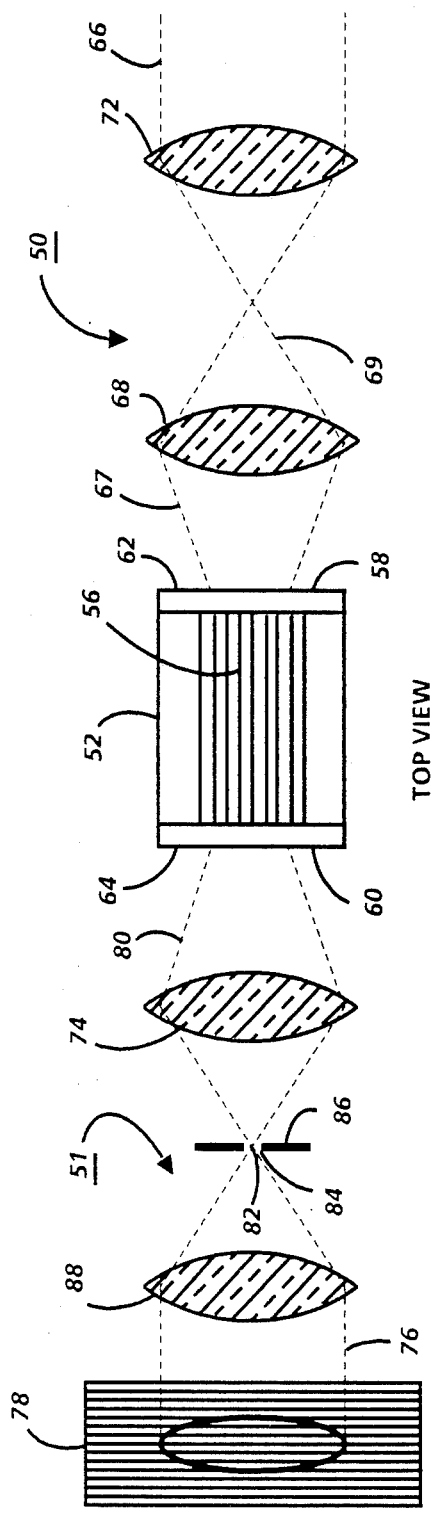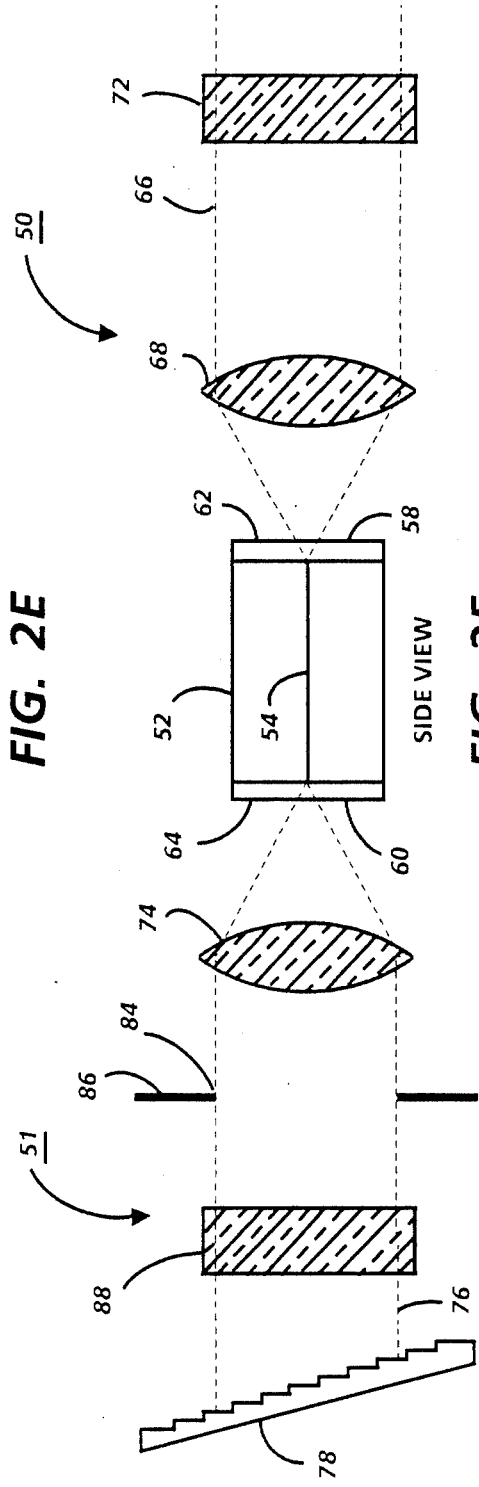
FIG. 2E TOP VIEW
FIG. 2F SIDE VIEW

SIDE VIEW

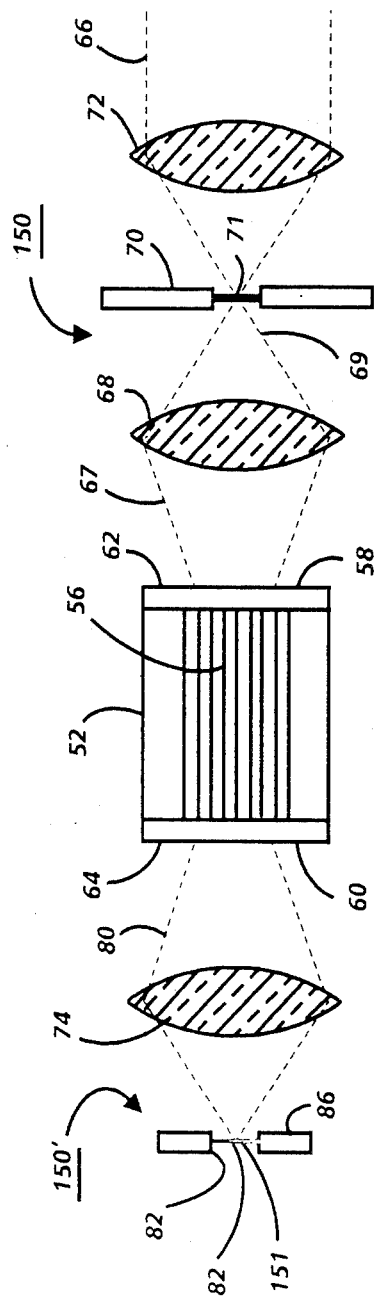
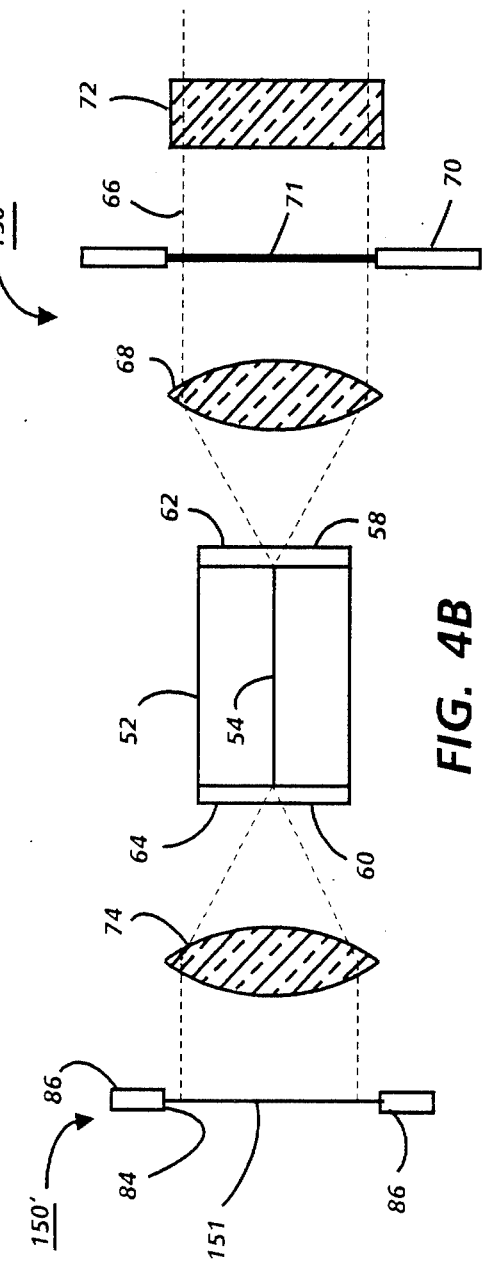
FIG. 4A
FIG. 4B

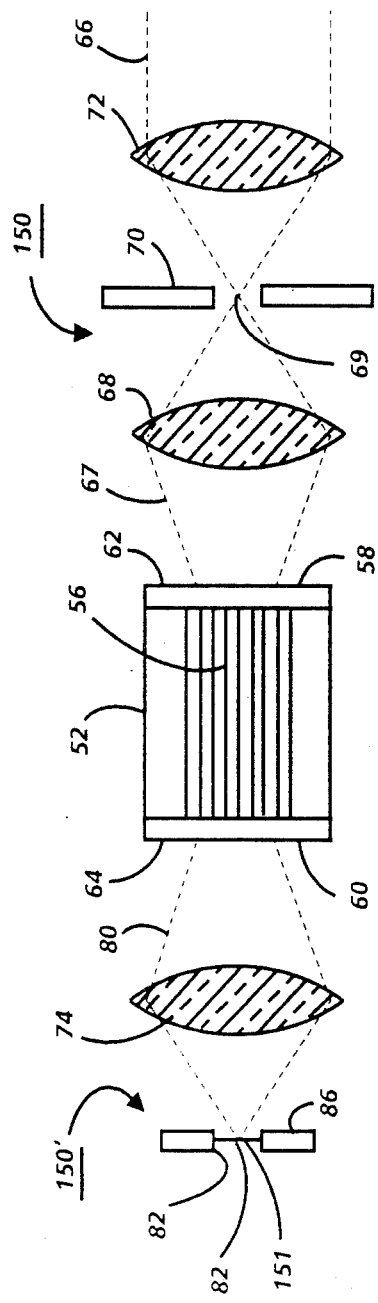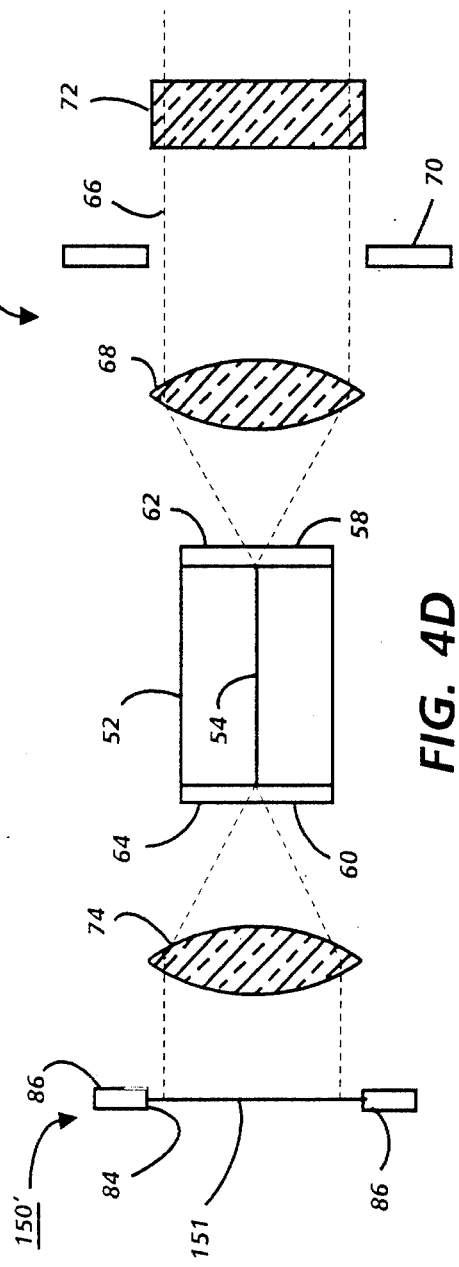

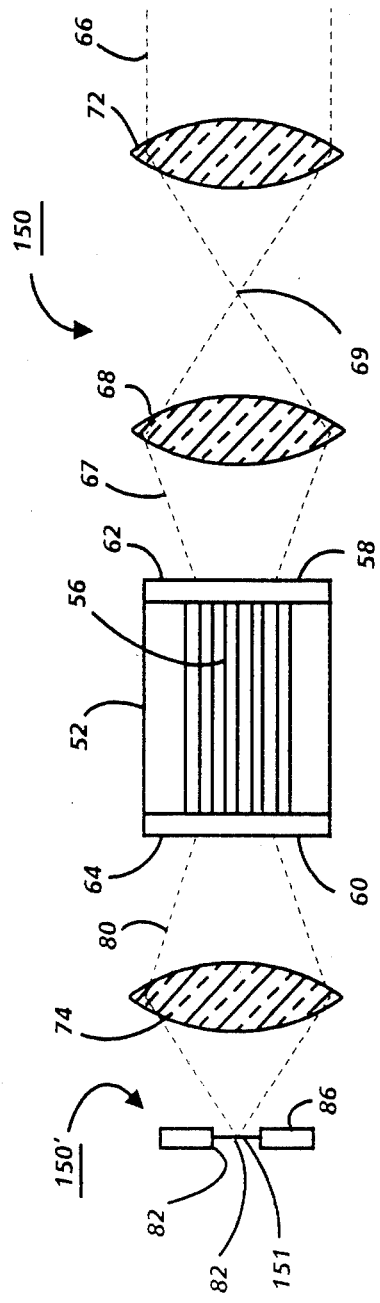
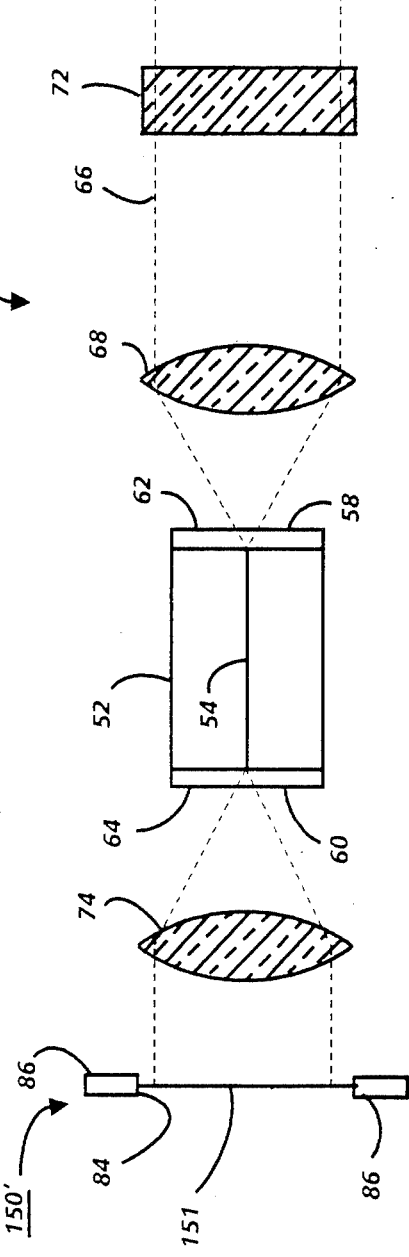
FIG. 4E
FIG. 4F

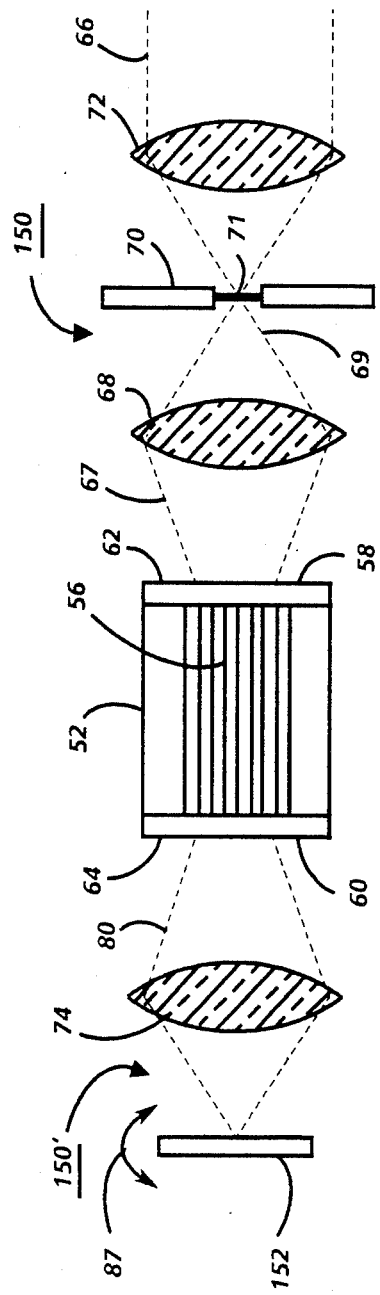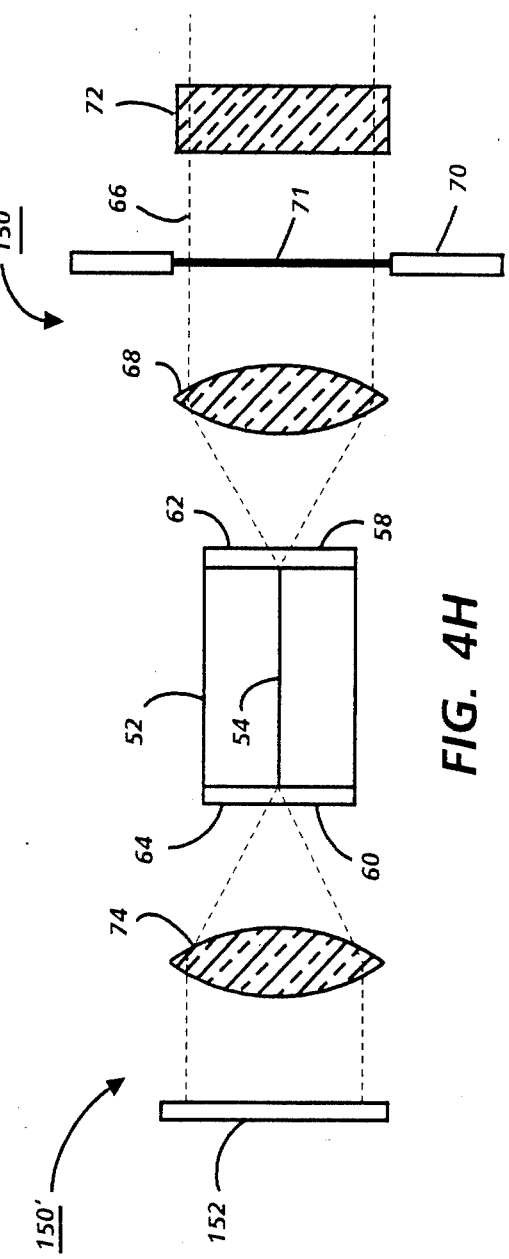
FIG. 4G
FIG. 4H

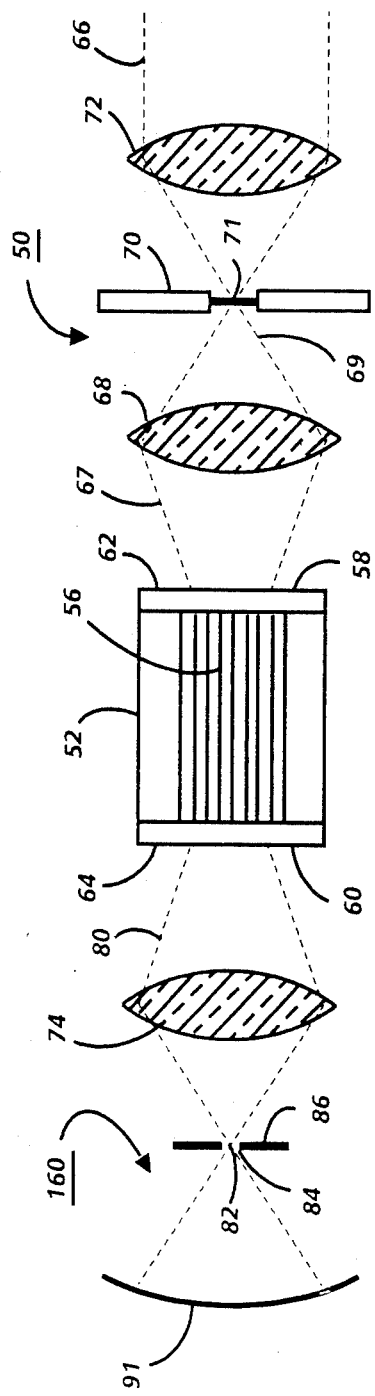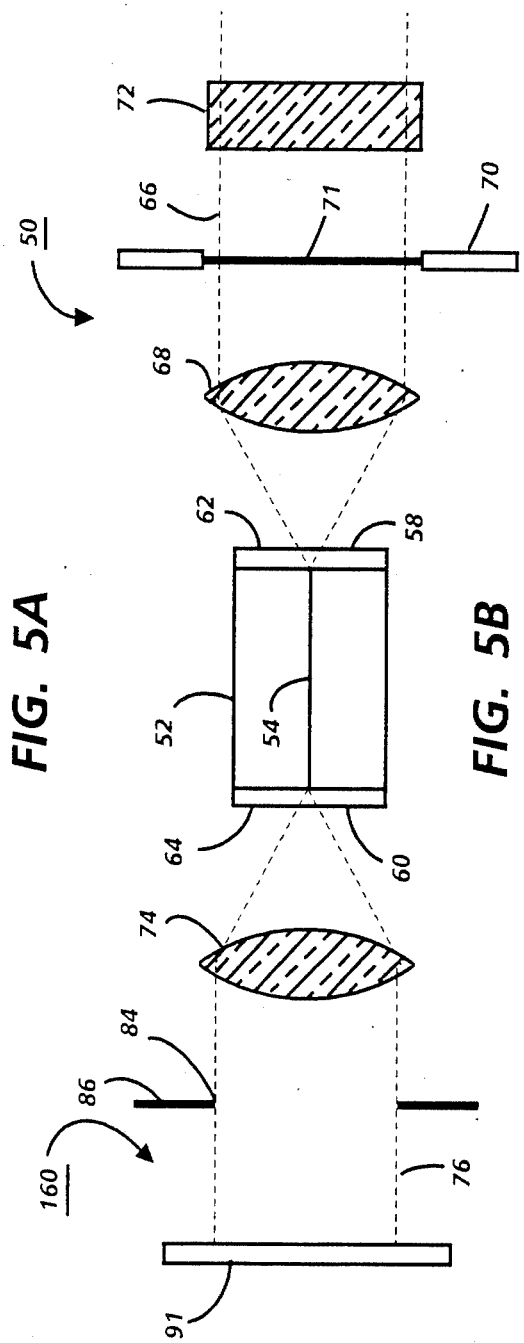
FIG. 5A
FIG. 5B

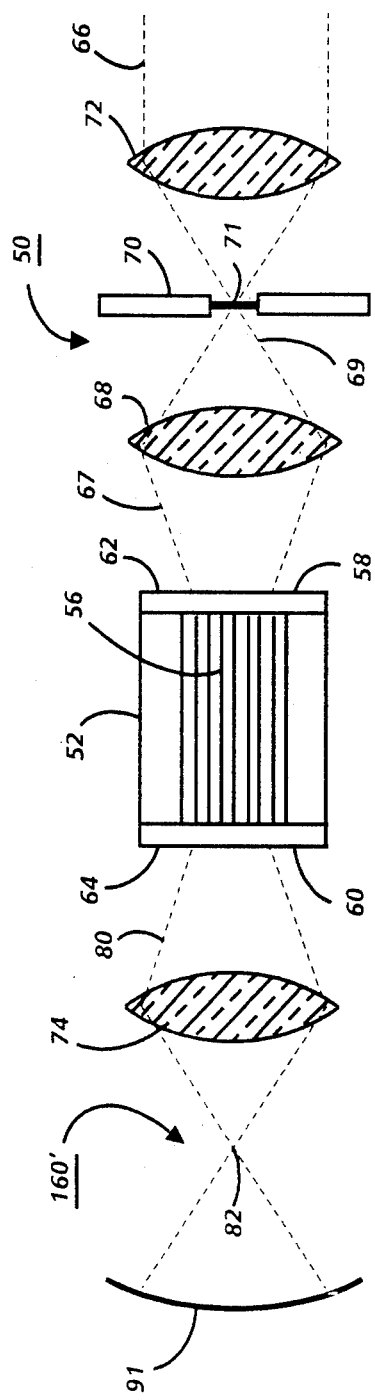
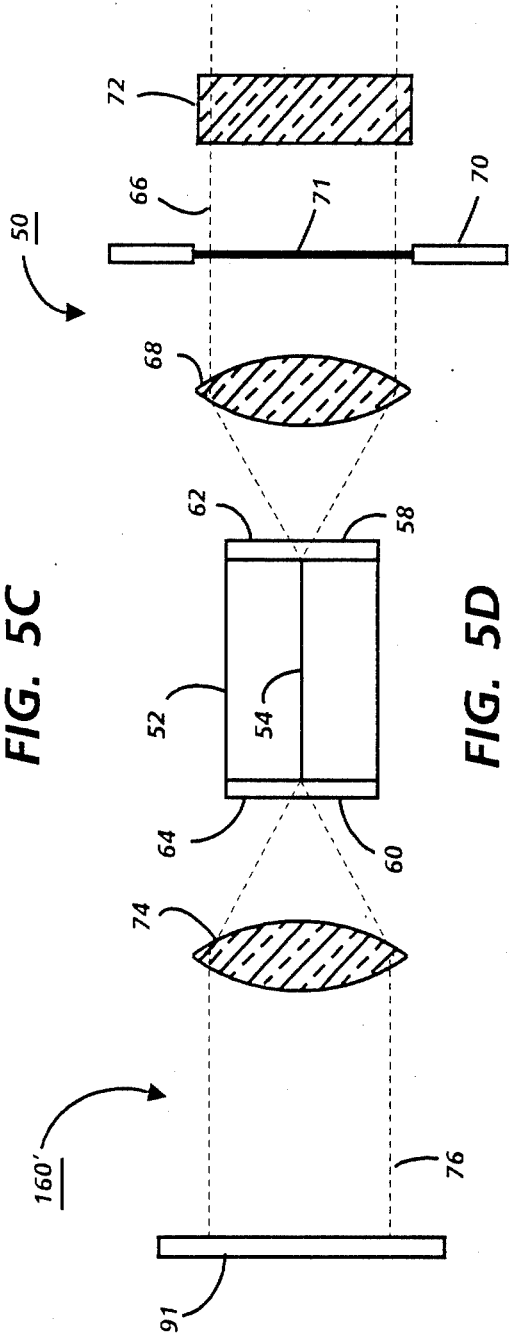
FIG. 5C
FIG. 5D

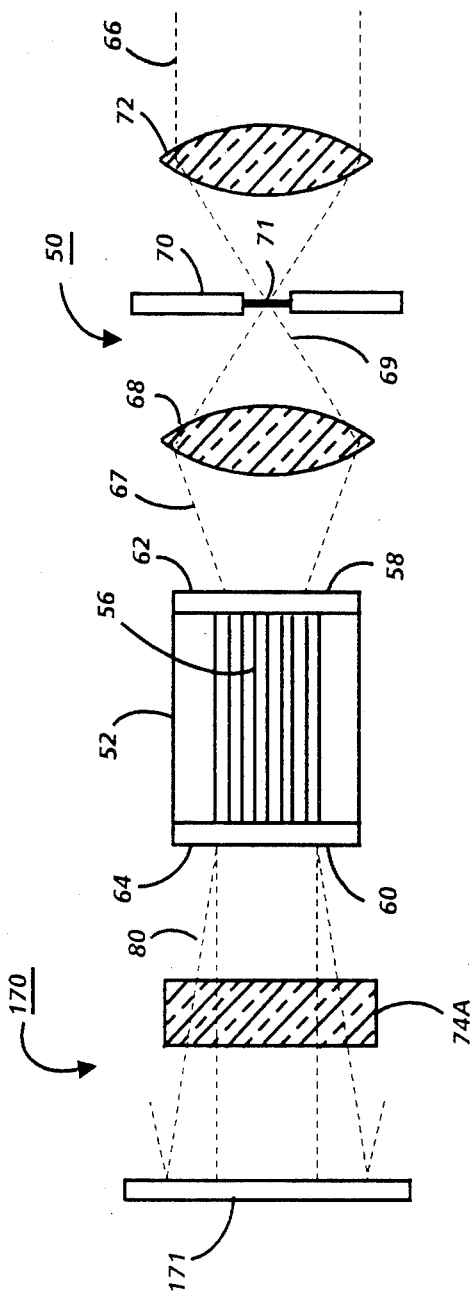
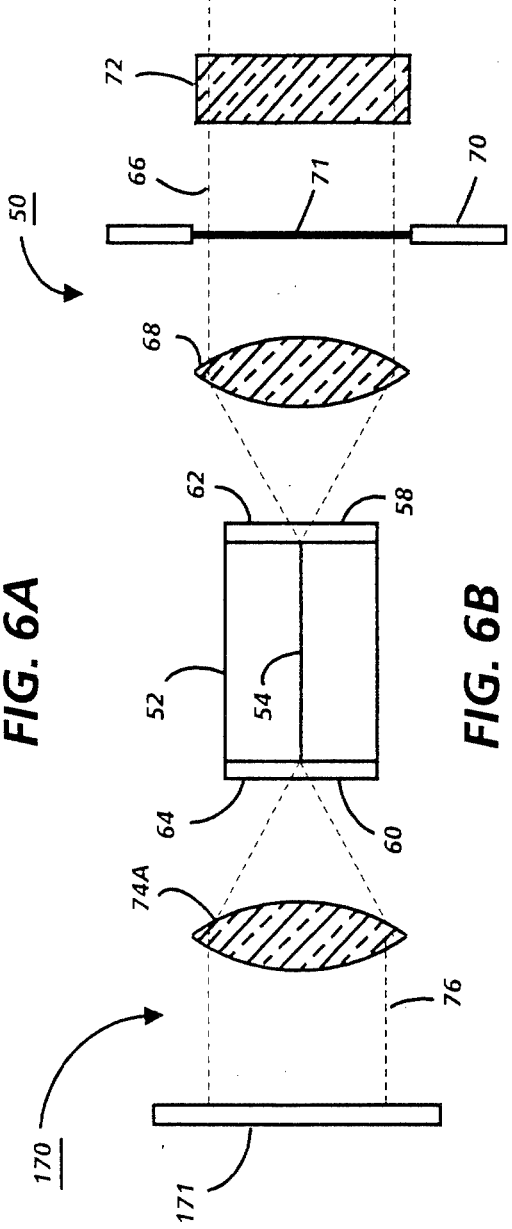
FIG. 6A
FIG. 6B

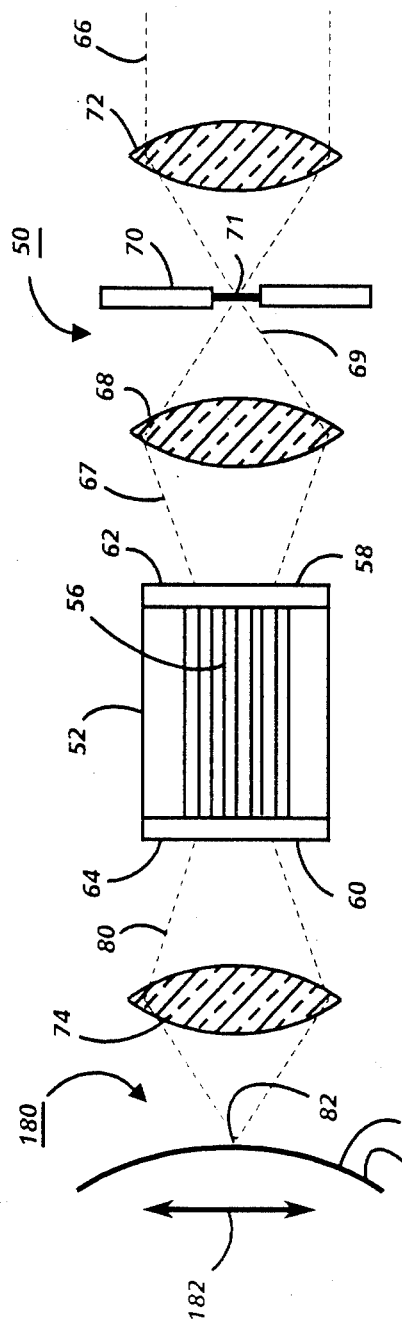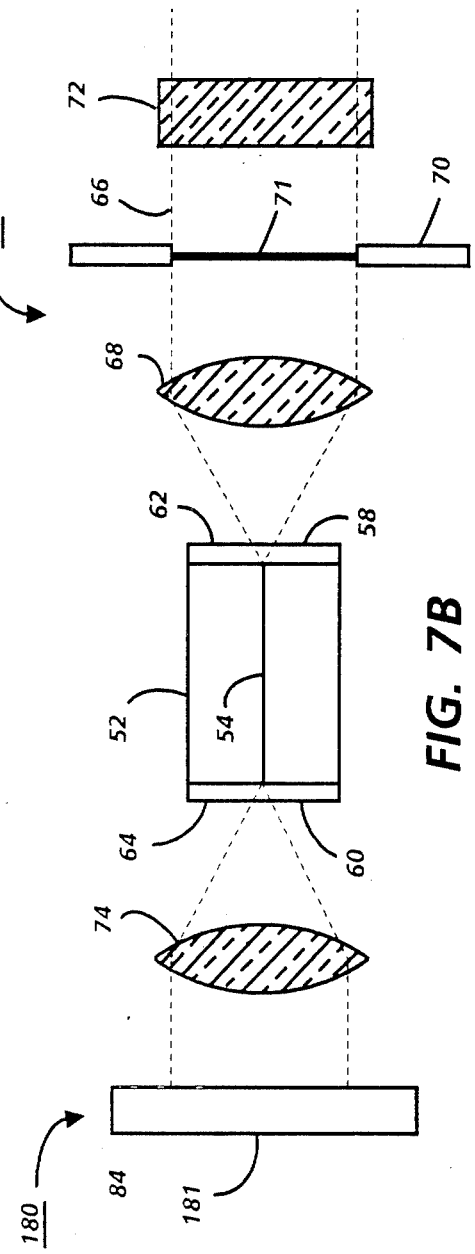

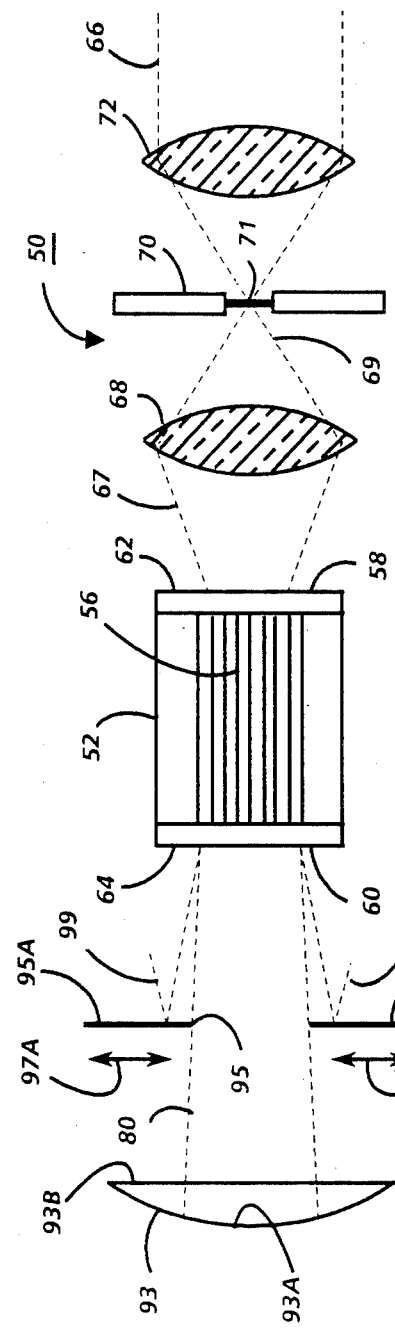
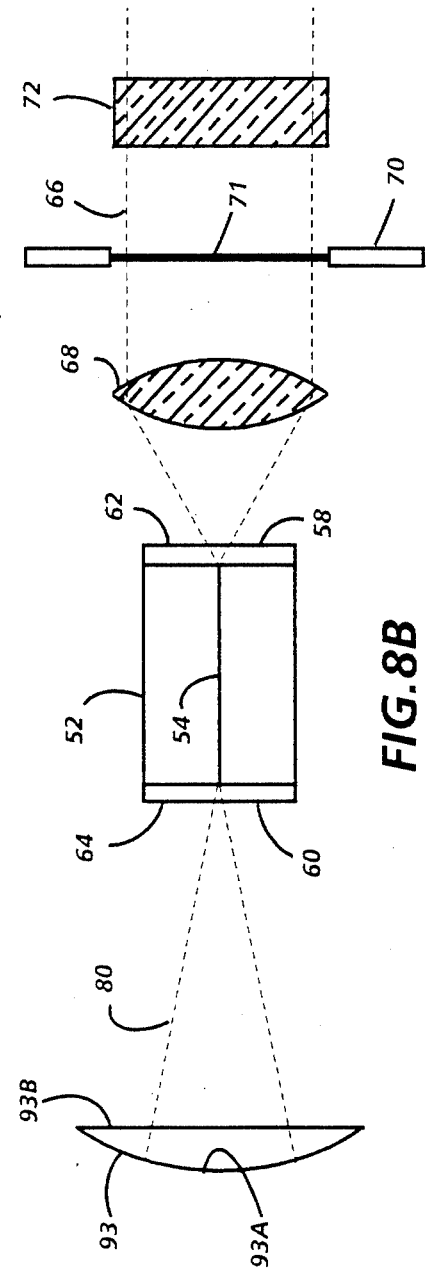
FIG. 8A
FIG. 8B

LASER CAVITY OPTICAL SYSTEM FOR STABILIZING THE BEAM FROM A PHASE LOCKED MULTI-EMITTER BROAD EMITTER LASER

BACKGROUND OF THE INVENTION

This invention relates to a laser cavity optical system for providing beam stabilization from a phasd array semiconductor laser, e.g., a multi-emitter or broad emitter semiconductor laser having a phase locked radiation pattern emitted from a common p-n planar junction.

In U.S. patent application Ser. No. 402,695 filed July 28, 1982 and abandoned in lieu of Ser. No. 637,708 now U.S. Pat. No. 4,530,574, there is disclosed an optical system for focusing the output of a phased array laser into a single spot. Described in this former patent application is a method of focusing a phase locked laser wherein the near field laser spot from such a laser is imaged onto the image plane in the vertical direction, i.e. perpendicular to the plane of the p-n junction, and the far field pattern is imaged in the horizontal direction, i.e. parallel to the plane of the p-n junction. In FIG. 7 of Ser. No. 402,695, there is shown the use of an aperture in the optical system at the lateral far field focal point to eliminate all but the primary lateral field interference lobe since phase locked semiconductor lasers may generally emit several far field lobes. It is usually desirable to focus only the primary far field lobe and the aperture is employed in the optical system to block off nonprominent secondary lobes.

The imaging method proposed in Ser. No. 402,695 for phase locked lasers works well up to a power output of about 75 mW from such a laser at which point, the laser far field pattern shifts causing a "kink" in the power output versus current curves. In the optical system employing an aperture to capture the dominate far field lobe, a beam shift, either in lateral position or angular output, in the far field pattern may cause a shift in the captured dominate far field lobe so that it is no longer aligned with the optical system aperture. What is needed in such an apertured laser cavity optical system is means to prevent such far field beam movement thereby eliminating the need to realing the shifted beam relative to the system aperture for high power laser requirements.

SUMMARY OF THE INVENTION

According to this invention, a laser cavity optical system is provided for stabilizing the laser far field dominate lobe so that no beam shift occurs.

The laser cavity optical system of this invention comprises a lens system positioned at one facet of a phased array semiconductor laser for imaging the near field pattern of the laser comprising a single beam waist position in a first spatial direction and reimaging the far field pattern in a second spatial direction after having first focused the far field pattern in the second spatial direction to a single beam waist position. The improvement in the laser cavity optical system comprises a partially reflecting, partially transmitting mirror located at the second spatial direction beam waist position to stabilize the laser beam and prevent laser beam shift at higher operating powers and operating temperatures. The mirror may also be a wavelength selective filter. Further, a slit aperture may be located at the second spatial direction beam waist position to limit the angle of aperture of the beam and thereby cutoff second, less dominate lobes present in the far field. Means to control the wavelength of the emission from the laser, such as a grating, prism, or spectral filter, may be provided in an external optical cavity at the other laser facet to provide wavelength selective reflection.

Other objects and attainments together with a fuller understanding of the invention will become apparent and appreciated with reference to the following description and claims taken in conjunction with the accompanying drawings.

BRIEF DESCRIPTION OF THE DRAWINGS

FIGS. 2A and 2B illustrate the laser cavity optical system shown in Figures 1A and 1B except without the spot focusing lens but includes optical means for tuning the phased array laser frequency to provide a predetermined, selected frequency in the far field dominate lobe.

FIGS. 2C and 2D illustrate the laser cavity optical system of FIGS. 2A and 2B wherein the partially reflective mirror is absent from the aperture of the output optical portion of the system.

FIGS. 2E and 2F illustrate the laser cavity optical system of 2A and 2B wherein both the aperture and partially reflective mirror are removed from the output optical portion of the system.

FIGS. 4A and 4B illustrate annother embodiment of a laser cavity optical system wherein an apertured rear planar reflector is positioned at the image point of the lateral far field radiation pattern in a rearward external optical cavity to provide beam control.

FIGS. 4C and 4D illustrate the laser cavity optical system of FIGS. 4A and 4B wherein the partially reflective mirror is absent from the apertured plate in the output optical portion of the system.

FIGS. 4E and 4F illustrate the laser cavity optical system of FIGS. 4A and 4B wherein both the apertured plate and partially reflective mirror are removed from the output optical portion of the system.

FIGS. 4G and 4H illustrate the laser cavity optical system of FIGS. 4A and 4B wherein a planar reflector or mirror is substituted for the apertured mirror plate in the rearward external optical cavity of the system.

FIGS. 5A and 5B illustrate the laser cavity optical system of FIGS. 2A and 2B wherein a concaved or curved mirror is positioned in the rearward external optical cavity of the system to provide for beam control.

FIGS. 5C and 5D illustrate the laser cavity optical system of FIGS. 5A and 5B except that the apertured plate has been removed from the rearward external optical cavity of the system.

FIGS. 6A and 6B illustrate the laser cavity optical system of FIGS. 4G and 4H but with a cylinder lens utilized in the rearward external optical cavity to provide for beam control.

FIGS. 7A and 7B illustrate the laser cavity optical system of FIGS. 4A and 4B with an unstable resonator provided in the rearward external optical cavity of the system to provide for beam control.

FIGS. 8A and 8B illustrate the laser cavity optical system of FIGS. 2A and 2B wherein a spherical mirror is positioned in the rearward external optical cavity of the system to provide for beam control.

DESCRIPTION OF THE PREFERRED EMBODIMENTS

Relative to the detailed description of the figures herein, it should be noted that tight tolerances are purposely not illustrated at the position of aperture plates so that the beam rays and aperture structure may be more clearly observed.

Figure 1A:
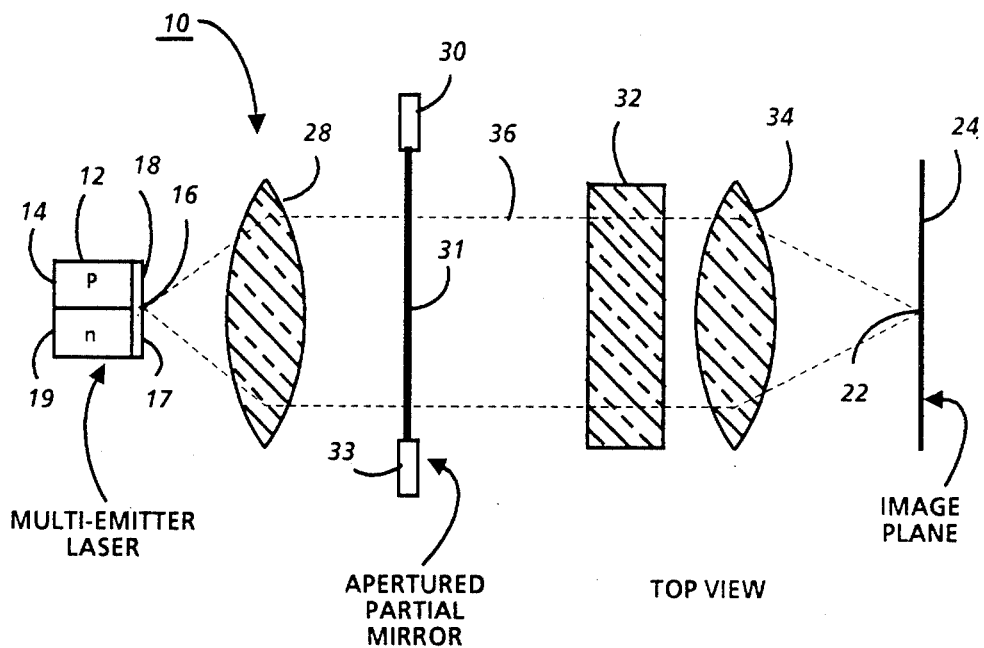
FIGS. 1A and 1B illustrate an laser cavity optical system including an external optical cavity comprising this invention for stabilizing the beam from a phased array semiconductor laser useful at any attainable optical power output.
Figure 1B:
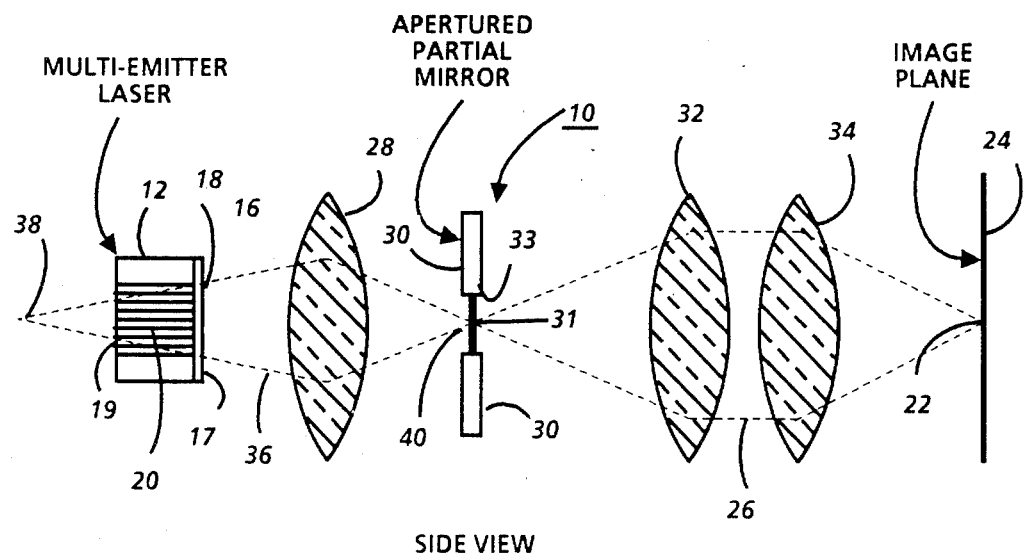

Referring now to FIGS. 1A and 1B, the optical system 10 comprises a phased array semiconductor laser 12, e.g. multi-emitter single or multiquantum well laser, hetrostructure or other semiconductor laser, which has a broad emission region parallel to its p-n planar junction 14 and a beam waist position 16 in a vertical plane perpendicular to junction 14 located at the laser front facet 18. Facet 18 is provided with an antireflection (AR) coating or a partially antireflection (PAR) coating 17. Laser facet 19 may be reflectively coated for lower threshold operation.

As shown in the top view of FIG. 1B, the laser 12 has a multiple stripe contact geometry at 20 or other means to create a phase locked laser output. The multi-emitters form a broad and fairly uniform intensity phase coherent radiation emitting source.

The phase locked laser 12 may be either of the index or gain guided type. In the vertical emission direction of laser 10, illustratd in FIG. 1A, the laser output beam is collimated by spherical lens 28. That is achieved by placing lens 28 one focal length away from facet 18. In the lateral direction, illustrated by FIG. 1B, the output beam is nearly collimated owing to the phase locked contact geometry 20 of laser 12. Therefore, the far field radiation pattern 36 of laser 12 comes to a focus at position 40 in the lateral dimension, i.e., focused to a line spot 40, as illustrated in FIG. 1B.

To provide for a spatially stable output beam, a linear partially reflecting apertured mirror 31 in aperture 33 apertured light absorbing plate 30 is positioned to coincide with laser line spot 40.

Mirror 31, comprising a partially reflecting, partially transmitting mirror positioned in the aperture 33 of light absorbing plate 30, forms a beam aperture plate. As an example, mirror 31 may be 30% reflective and 70% transmissive. The partially reflecting mirror 31 establishes an optical cavity between itself, the front laser facet 18, and the rear laser facet 19. The partially reflecting mirror 31 transmits a portion of the light to the rest of the ptics of system 10 while also reflecting a portion of laser light back into the laser optical cavity, represented by the position of junction 14, for the purpose of stabilizing laser operation.

Stabilization occurs because if the laser attempts to lase in a different direction, or shift beam position, due to a preferred superlobe operation, such an attempt will be suppressed because the threshold for laser operation is lower for the particular far field dominate diffraction lobe focused to aperture mirror 31. The laser threshold is reduced by the partially reflected light supplied back to the laser optical cavity and the far field beam pattern is stabilized, i.e., the beam will not move or jump laterally or change in angular optical output. Any such an attempt would cause an increase in laser threshold which attempts do not naturally occur during lasing operation of phased array laser 12. the AR and PAR coating 17 on facet 18 increases the effect of the apertured mirror 31. Coating 71, as indicated, may be partially reflecting as long as the level of reflectance is lower than that of mirror 31 so that laser 12 is more dependent on mirror 31 for its feedback operation rather than mirror facet 18. For example, PAR coating 17 may have a partial reflectivity as high as 10%.

It should be noted that absorbing plate 30 for mirror 31 may not be necessary if mirror 31 sufficiently high reflectivity back into active region 14 of laser 12 compared to the effective reflectivity from plate 30 or any other surface or component substituted for plate 30. As used here, "effective reflectivity" means the per cent of light reflected back into active layer 14 within the confines of the established laser cavity region below stripe region 20. Under these circumstances, only the partially reflecting, partially transitting mirror 31 need be present without the need for light absorbing plate 30. Such an embodiment is illustrated in subsequent figures.

It should be further noted that mirror 31 may be a dielectric wavelength selective filter with partially reflecting and partially transmitting capabilities. As a selective wavelength reflecting filter, the wavelength of laser 12 may also be selectively predetermined. Variations of this concept are illustrated in subsequent figures.

Because of stable beam pattern is established by mirror 31 for laser 12, the laser light can be focused into a diffraction limited stable spot 22 by collimating light transmitted through mirror 31 with cylindrical lens 32 which is placed one focal length from the focused line source 40. Once collimated in both lateral and vertical beam directions, a diffraction limited single light spot 22 can be created on image plane 24 with spherical lens 34.

The laser cavity optical system 50 of FIGS. 2A and 2B is designed to provide wavelength control in addition to stabilized operation. Phased array laser 52 has a p-n junction 54 and multiple stripe contact geometry at 56 to produce phased locked lasing upon current operation. Laser 52 has AR or PAR coatings 58 and 60 respectively on its front facet 62 and rear facet 64.

As in the case of optical system 10 of FIG. 1, optical system 50 collimates the beam 66 in the vertical near field (FIG. 2B) and in the lateral far field (FIG. 2A). System 50 comprises a spherical lens 68 to collimate beam 66 in the vertical emission direction. In the lateral emission direction, the same spherical lens 68 reimages the far field pattern 67 to a line spot 69 at aperture mirror 71. Spot 69 is reimaged by cylinder lens 72 to a collimated beam 66.

Aperture mirror 71 comprises a partially reflecting, partially transmitting mirror 71 in an aperture provided in light absorbing plate 70. Mirror 71 provides lowest threshold operation for the predominate far field lobe focused to spot 69 so that beam 66 is prevented from shifting since such shifting would cause an increased laser threshold, which would be inherently avoided.

Optical system 50 further includes an external optical cavity 51 optically coupled to the rear facet 64 of laser 52. Cavity 51 comprises a spherical lens 74 to collimate beam 76 in the vertical emission direction (FIG. 2B). The path of collimated beam 76 is directed onto grating 78 via aperture 84 in light absorbing plate 86. In the lateral emission direction (FIG. 2A), the same spherical lens 74 reimages the far field emission pattern 80 to a line beam waist or spot 82 at aperture 84 in plate 86. Spot 82 is then reimaged by cylinder lens 88 to a collimated beam 76 directed onto grating 78.

Grating 78 is a high reflecting blazed grating and functions like a spectral filter providing a wavelength selective reflection which is fed back to the multi-emitter optical cavity of laser 52. The wavelength of laser 52 may also be selectively tuned via grating 78. The wavelength may be changed or selected by rotating grating 78 as is well known in the art. The orientation of grating 78 may also be oriented at right angles to that shown in FIGS. 2A and 2B. Also, the position of lens 88 may be slightly moved for adjustment to avoid wavelength dispersion across the p-n junction 54.

In lieu of grating 78 as a selective wavelength means, a spectral filter may be employed to provide wavelength selective reflection. Also, a prism/plane mirror combination may be employed in place of grating 78 to provide wavelength selective reflection.

The laser cavity optical system 50 illustrated in FIGS. 2C and 2D varies from system 10 illustrated in FIGS. 2A and 2B in that partially reflecting mirror 71 has been removed from the system. In this embodiment, array laser 52 is stabilized by external optical cavity 51 coupled to rear laser facet 64. In this embodiment, grating 78 provides for lobe selection as well as wavelength tuning. Because there is no feedback radiation from mirror 71 reflected back into front facet 62, front facet 62 preferably is not fully AR coated.

FIGS. 2E and 2F depict a still further modification of laser cavity optical system 50 wherein aperture plate 70 as well as mirror 71 are removed from the output optical portion of system 50. Lobe selection in the far field is accomplished by rearward external optical cavity 51.

Figure 2G:
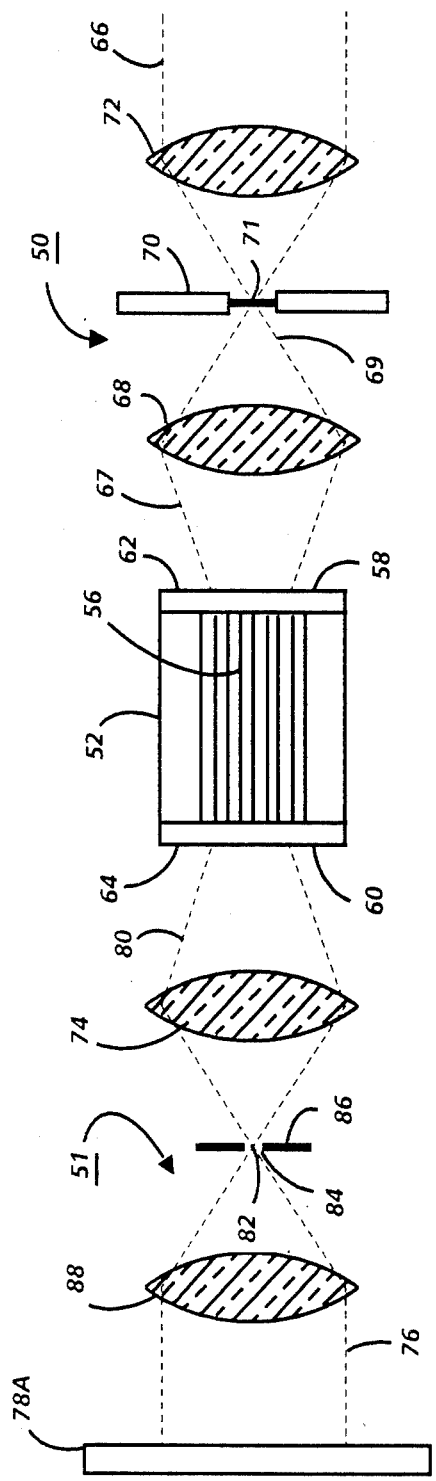
FIGS. 2G and 2H illustrate the laser cavity optical system of 2A and 2B wherein the diffraction grating is replaced by a planar mirror or by a wavelength selective dielectric stack mirror.
Figure 2H:
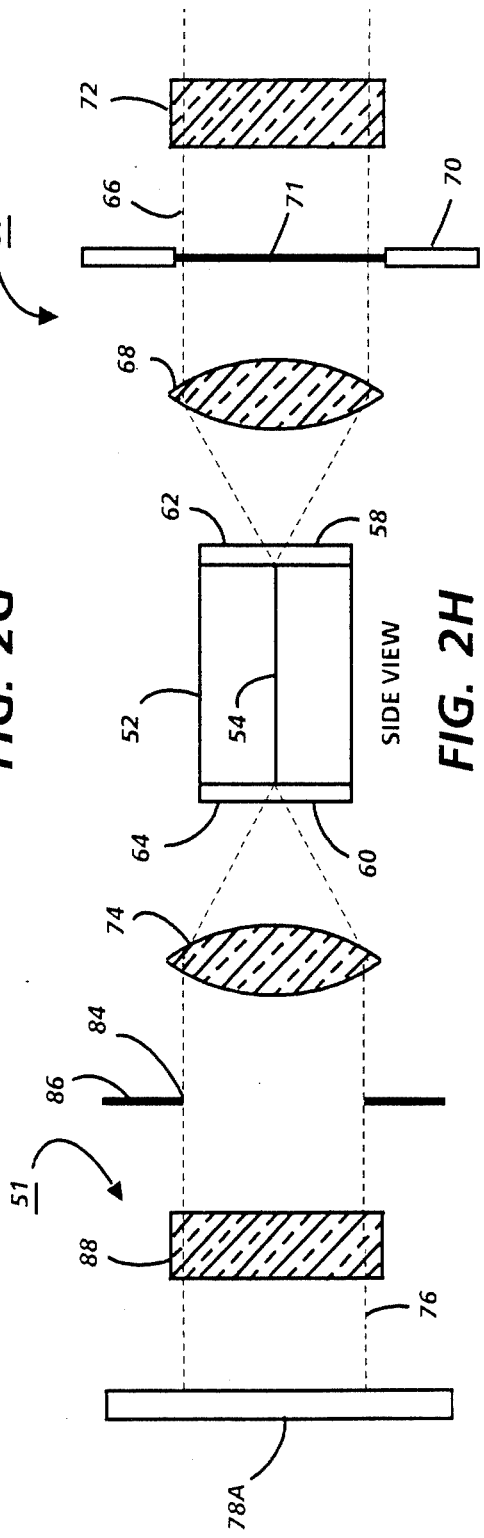

FIGS. 2G and 2H depict a still further modification of laser cavity optical system 50 wherein rearward external optical cavity 51, grating 78 in previous embodiments has been replaced by a planar mirror 78A. This mirror may have spectrally dependent reflectivty for laser wavelength stabilization. As with the grating 78 illustrated in previous figures, mirror 78A provides external optical feedback to array laser 52. Alternatively, mirror 78A may comprise a wavelength selective dielectric stack mirror. Mirror 78A may also comprise a concave mirror if the position of lenses 74 and 88 are properly adjusted so that reflected light from the concave mirror surface is optically coupled back into the laser cavity of laser 52.

Figure 3:
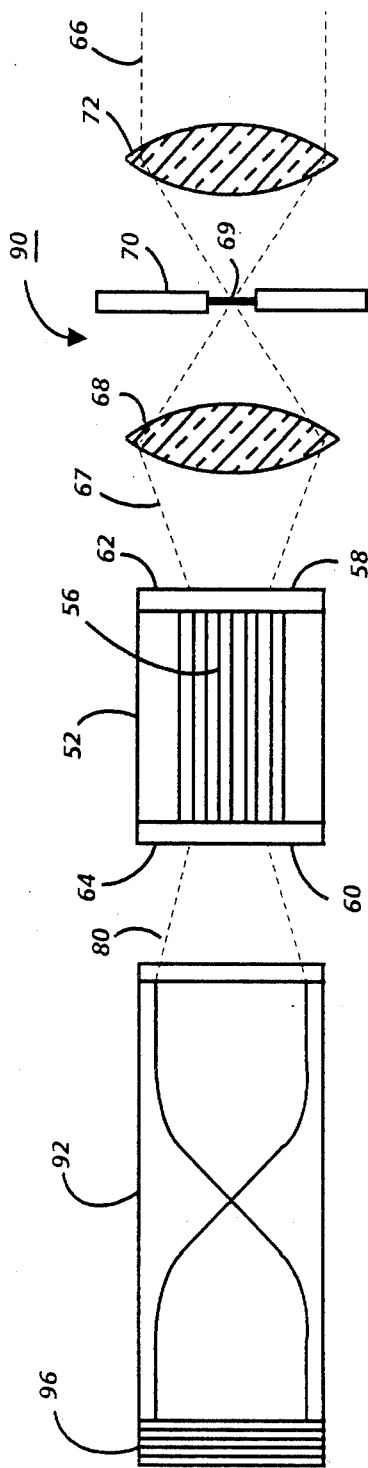
FIG. 3 illustrate another embodiment for the laser cavity optical system of FIG. 2 for tuning the phased array laser frequency to provide a predetermined, selected frequency in the far field dominate lobe at the output optical portion of the system.

The laser cavity optical system 90 illustrated in FIG. 3 is the same as laser cavity optical system 50 in FIGS. 2A and 2B with respect to the output optical portion of system 50 to stabilize the collimated output beam 66 of laser 52. In this connection, like components of the system carry the same reference numerals and the description for these components in optical system 50 is equally applicable to optical system 90.

In system 90, the means for selecting the wavelength of laser operation is different and comprises the half period GRIN rod lens 92. Lens 92 has an AR or PAR coating 94 on one end thereof which is positioned to receive the far field emission pattern 80. The other end of lens 92 contains a multilayer dielectric mirror stack 96 that reflects substantially all the light from beam 80 entering lens 92. Stack 96 is also highly selective wavelength, which wavelength selection capability is designed in the fabrication of stack 96 as is known in the art. Stack 96 as known in the art may comprise alternating layers of $SiO_2$ and $Al_2O_3$. Designing the thickness of the layers of stack 96, the stack can be fabricated to be selective of a particular wavelength of light reflected back into the optical cavity of array laser 52.

Previously discussed configurations as well as configuration to be subsequently discussed may also employ GRIN rod lens 92 in the rearward external optical cavity in lieu of their presently illustrated configurations.

FIGS. 4A and 4B depict a modified laser cavity optical system 150 wherein beam stabilization is achieved by both apertured partially reflecting mirror 71 and apertured fully or partially reflecting mirror 151 in the rearward external optical cavity 150'. Mirror 151 is positioned at the beam waist position of the lateral far field pattern in the rearward external optical cavity 150'. If lateral output beam 80 attempts to shift the focused line image 82 at mirror 151 and move the focused beam 80 into the non-reflecting or light absorbing portions of plate 86, the threshold operation of laser 52 will increase. Such behavior will not be obeyed and beam 80 will not "shift" but remain focused at mirror 151 to maintain lower and stabilize laser threshold operation.

Other configurations in which only the rearward external optical cavity 150' provides stabilization is shown in FIGS. 4C and 4D, and 4E and 4F. In FIGS. 4C and 4D, partially reflecting mirror 71 has been removed from the output optical portion of system 150, as in the embodiment of FIGS. 2C and 2D. Coating 58 therefore should be at least PAR. In FIGS. 2E and 2F, apertured plate 70 has also been removed with mirror 71, as in the embodiment of FIGS. 2E and 2F. Again, coating 58 should be at least PAR or absent to utilize facet reflection for feedback.

In FIGS. 4G and 4H, the system 150 illustrated in FIGS. 4A and 4B is shown except that a full rear reflector or mirror 152 in the rearward external optical cavity 150' has replaced apertured mirror plate 151. Reflector 152 is rotated in a plane in the lateral direction of laser 52 as illustrated in FIG. 4G by arrow 87. Rotation of reflector 152 provides spatially selective coupling among the lateral parallel lasing elements or multi-emitters represented by geometry 56 allowing for stable laser beam output.

Figure 4I:
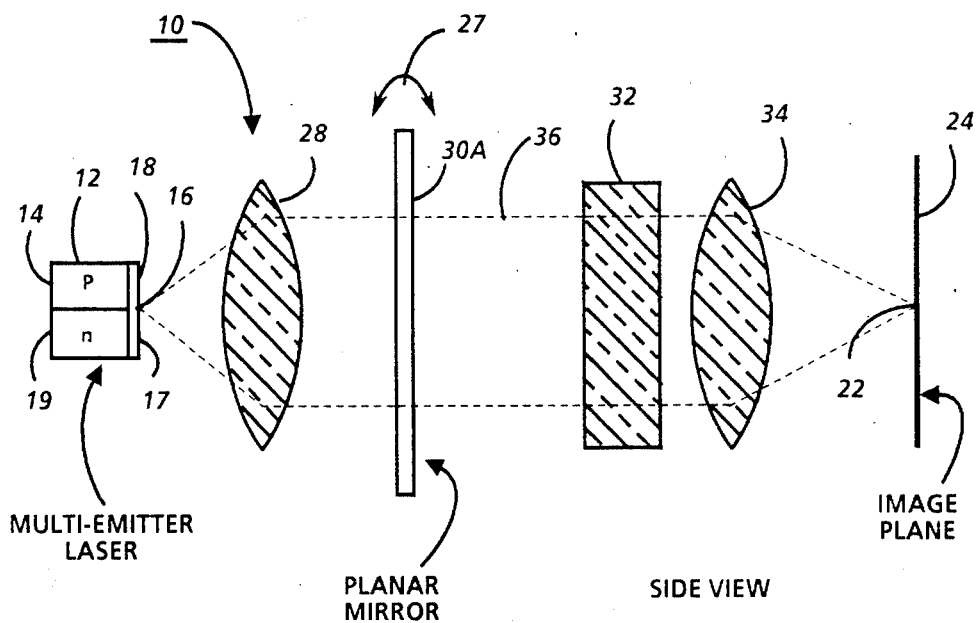
FIGS. 4I and 4J illustrate the laser cavity optical system of FIGS. 1A and 1B with a partially reflecting front facet planar mirror rotatably mounted in the output optical portion of the system to permit orthogonal movement of the mirror to provide for beam control.
Figure 4J:
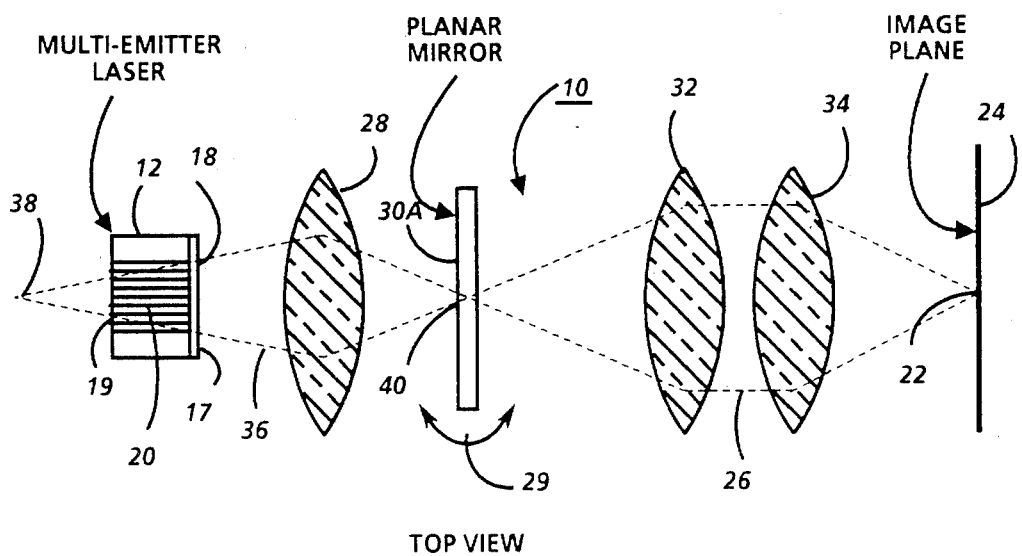

FIGS. 4I and 4J illustrate the system 10 shown in FIGS. 1A and 1B except apertured plate 30 has been replaced by partial reflecting planar mirror 30A. Mirror 30A may be rotated or angularly adjusted in the lateral plane of laser 12, as illustrated by arrow 27 or rotated in the vertical plane of laser 12, as illustrated by arrow 29. Adjustment may be in either or both planes. Mirror 30A is angularly adjusted in these respective to achieve optimized dominate lobe coupling back into the optical cavity of laser 12 to provide stabilized output, single lobe operation.

FIGS. 5A and 5B illustrate the laser cavity optical system 50 of FIGS. 2A and 2B except, however, rearward external optical cavity 160 of FIGS. 5A and 5B does not include grating 78, which has been replaced by planar curved mirror 91, i.e., curved in one orthogonal direction. Mirror 91 functions to provide selective dominate lobe optical feedback to the optical cavity of laser 52 to provide stabilized laser operation.

In FIGS. 5C and 5D, system 50 of FIGS. 5A and 5B is shown with modified rearward the rearward external optical cavity 160'. In cavity, 160, apertured plate 86 has been removed. Curved mirror 91 must be carefully adjusted in axial beam position so that the position of focused beam 80 is maintained.

As indicated in previous embodiment, apertured plate 70 and/or mirror 71 in the front external output optical cavity may be removed in conjunction with the employment of rearward external optical cavity 160 or 160'.

In FIGS. 8A and 8B, system 50' is the same as that shown in FIGS. 5A and 5B except that rearward external optical cavity 160 of FIGS. 8A and 8B is provided with a spherical mirror 93 in lieu of curved mirror 91. Mirror 93 is is illustrated in cross section and has a reflective surface 93A and rim 93B. Spherical mirror 93 provides selective dominate lobe (fundamental or lowest order mode) optical feedback to the optical cavity of laser 52 to provide stabilized laser operation. In this configuration, spherical mirror 93 is positioned behind AR coated or partially reflecting rear facet 64 and refocuses the light from laser 50' back into the laser cavity, as represented by p-n junction 54, of laser 50'. An aperture 95 comprising one or two knife edges or straight edges 95A and 95B are adjusted in aperture width, as represented by respective arrows 97A and 97B, so that high order lateral modes exhibit a lower reflectivity or are not reflected at all, as represented by dotted lines 99. This is because higher order modes exhibit greater divergence compared to lower order modes emitted from rear facet 64. Thus, feedback from the spherical mirror 93 is lower for higher modes relative to the fundamental or lowest order mode, which lowest order mode has feedback of the highest level compared to other modes.

In FIGS. 6A and 6B a modified rearward external optical cavity 170 is shown. In this illustration, a planar reflector 171 receives and reflects collimated light via cylinder lens 74A. Thus, only the collimated low divergence portion of the lateral far field beam 80 provides feedback to the optical cavity or multi-emitter lasing region of laser 52. If beam 80 attempts lateral shift, less optical feedback is obtained thereby increasing the laser threshold. Thus, beam shifting will not occur.

Figure 6C:
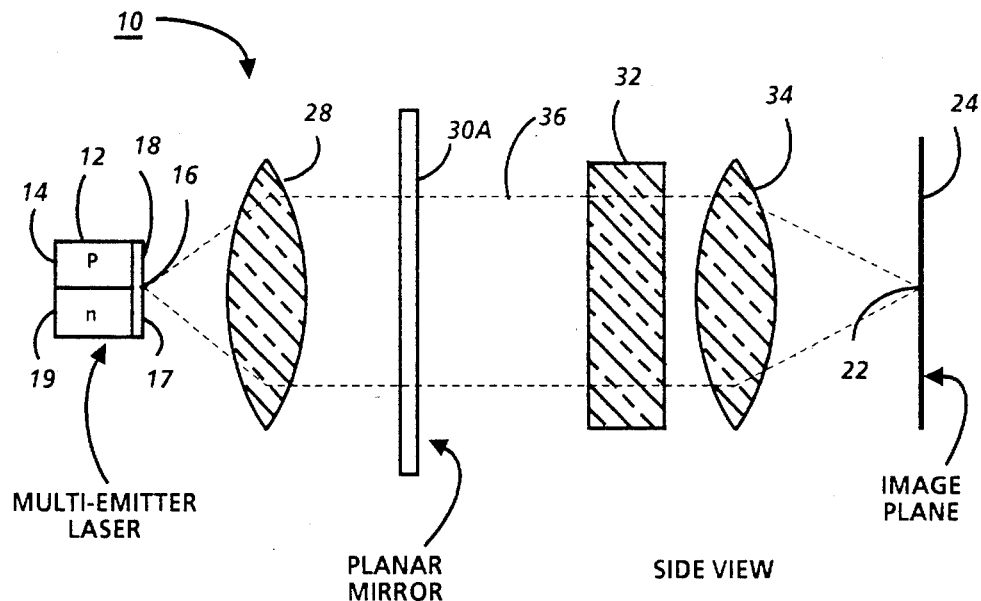
FIGS. 6C and 6D illustrate the laser cavity optical system of FIGS. 1A and 1B wherein a cylinder lens is utilized in the forward external optical cavity of the system in lieu of a spherical lens to provide for beam control.
Figure 6D:
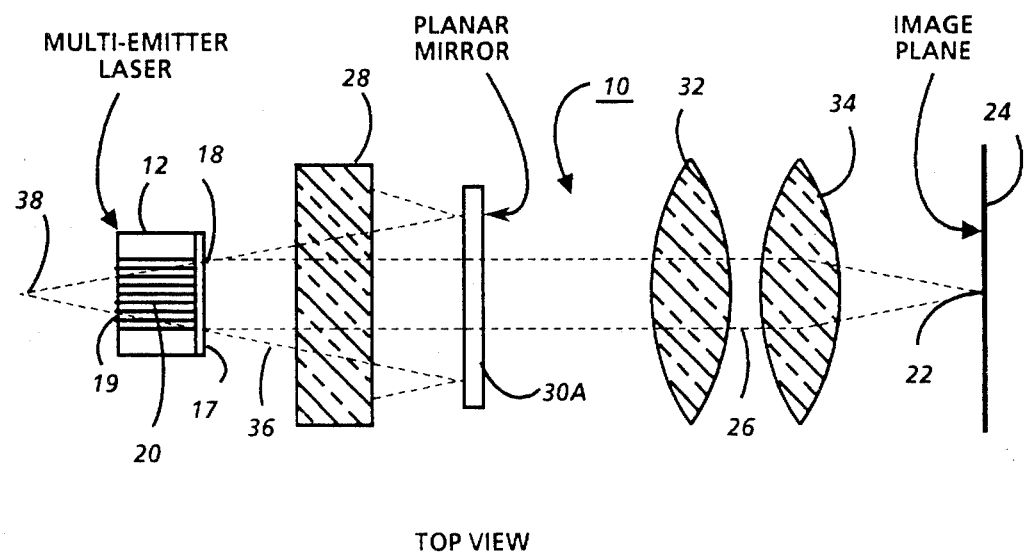

FIGS. 6C and 6D illustrate the system 10 of FIGS. 1A and 1B except that mirror 30A has replaced apertured plate 30 and cylinder lens 28A has replaced spherical lens 28. Cylinder lens 28A collimates the light emanating from the near field spot 16 (FIG. 6C) while in the orthogonal lateral direction (FIG. 6D) the far field beam 36 is partially reflected via mirror 30A. This reflected light, which is fed back into multi-emitter laser cavity, serves to stabilize the lateral far field beam.

In FIGS. 7A and 7B, laser cavity optical system 50 is provide with an unstable resonator optical system in rearward external optical cavity 180. Convex reflector 181 is curved in one orthogonal direction, as illustrated in FIG. 7A. Because mirror 181 is curved in one orthogonal dimension, focused spot 82 on the mirror surface is only reflected back into the optical cavity of laser 52 when mirror surface 183 is properly positioned in the lateral direction by means of adjustment illustrated by arrow 182. The curved surface of mirror 181 allows efficient optical coupling to occur between the multi-emitters of laser 52. Any attempt of angular shaft by beam 80 will materially alter the threshold current of laser 52 so that such beam shifting will not occur.

Alternatively, a convex spherical surface mirror or reflector may be substituted for convex reflector or mirror 181. In this alternative embodiment, the lens 74 may be removed. The higher order and higher divergent modes will not be reflected back to the laser cavity and the convex spherical surface mirror will favor back reflection of the fundamental or lowest order mode with proper convex spherical surface mirror adjustment relative to the laser cavity.

The configuration of FIGS. 7A and 7B may be employed in conjunction with any of the alternative forward external optical cavity configuration illustrated in previous embodiments. Only one external cavity with feedback means is sufficient for accomplishing the object of this invention.

Figure 7C:
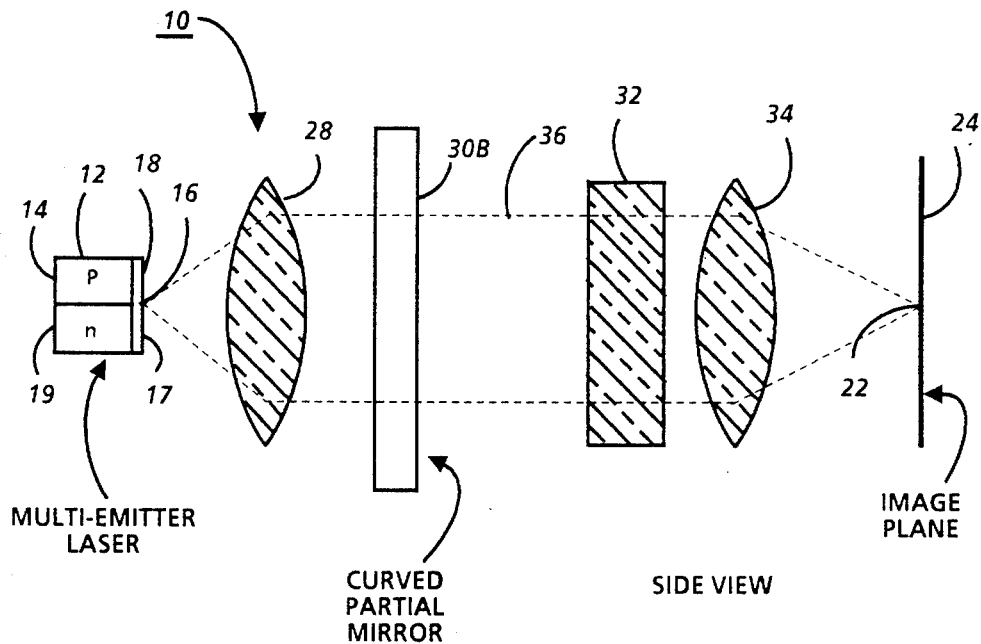
FIGS. 7C and 7D illustrate the laser cavity optical system of FIGS. 1A and 1B with an unstable resonator provided in the forward external optical cavity of the system to provide for beam control.
Figure 7D:
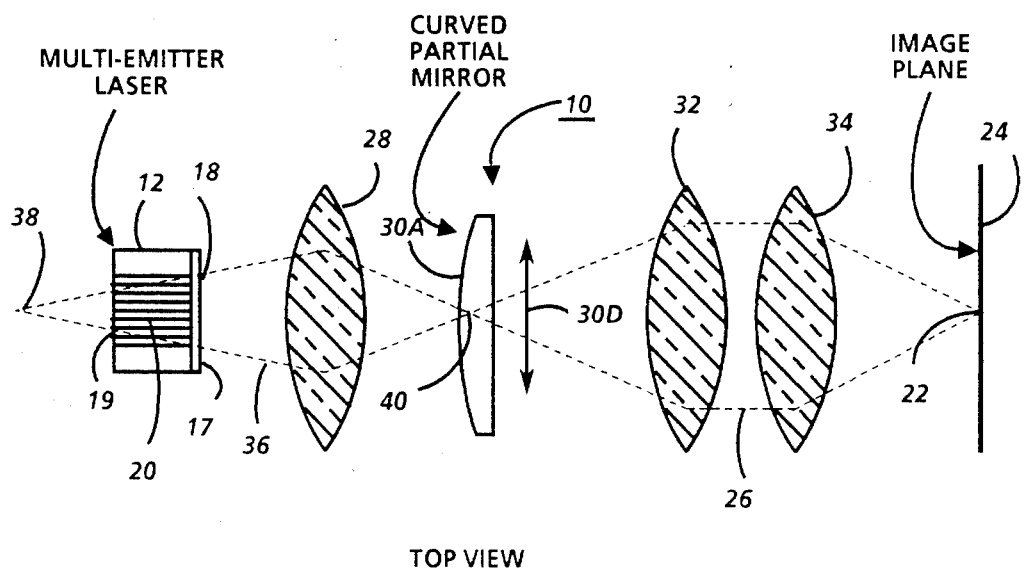

In FIGS. 7C and 7D another unstable resonator configuration for the laser cavity optical system 10 is illustrated. In this illustration, partially reflecting mirror 30B is provided with a front curved surface 30C. Mirror 30B may be laterally adjusted as indicated by arrow 30D to properly position mirror 30B to reflect the primary or dominate lobe in the far field pattern back into the optical cavity of laser 12. As in the case of FIGS. 7A and 7B, mirror 30B provides spatially selective feedback to laser 12, thereby allowing a stable output beam 36 to be produced.

While the invention has been described in conjunction with specific embodiments, it is evident that may alternative, modifications and variations will be apparent to those skilled in the art in light of the foregoing description. Accordingly, the invention is intended to embrace all such alternatives, modifications and variations as fall within the spirit and scope of the appended claims.

What is claimed is:

1. A laser cavity optical system for collimating a light output from a multi-emitter or broad emitter semiconductor laser capable of producing a multiple or broad low divergence output beam from said laser, said laser near field having a single beam waist position in a first spatial directional near the emission facet of said laser and having an elongated but phase coherent far field emitting pattern in a second spatial direction, a lens system positioned at one facet of said laser for imaging said near field of said single beam waist position in said first spatial direction and reimaging said far field pattern in said second spatial direction after having first focused said pattern in said second spatial direction to a single beam waist position, the improvement comprising a feedback means which is partially reflecting and partially transmitting and is located at the second spatial direction beam waist position to stabilize the laser beam and prevent laser beam shift at higher operating powers and operating temperatures.

2. The laser cavity optical system of claim 1 wherein said portion of said reflected light output is spatially discriminated by said feedback means to stabilize said output beam.

3. The laser cavity optical system of claim 1 wherein said portion of said reflected light output is angularly discriminated by said feedback means to stabilize said output beam.

4. The laser cavity optical system of claim 1 wherein said feedback means comprises a planar mirror.

5. The laser cavity optical system of claim 4 wherein said planar mirror is rotatable in the plane of said second spatial direction.

6. The laser cavity optical system of claim 4 wherein a slot aperture is located at said second spatial direction beam waist position between said planar mirror and said laser optial cavity.

7. The laser cavity optical system of claim 4 wherein said planar mirror is mounted in an aperture of a light absorbing plate.

8. The laser cavity optical system of claim 1 wherein said feedback means comprises a curved mirror with the inside surface thereof positioned to reflect said light output portion back into said laser optical cavity.

9. The laser cavity optical system of claim 8 wherein a slot aperture is located at said second spatial direction beam waist position between said curved mirror and said laser optical cavity.

10. The laser cavity optical system of claim 8 wherein the radius of curvature of said mirror is in said second spatial direction.

11. The laser cavity optical system of claim 10 wherein a slot aperture is located at said second spatial direction beam waist position between said curved mirror and said laser optical cavity.

12. The laser cavity optical system of claim 1 wherein said feedback means comprises a spherical mirror with the inside surface thereof positioned to reflect said light output portion back into said laser optical cavity.

13. The laser cavity optical system of claim 12 wherein a straight edge aperture is located between said laser facet and said spherical mirror to limit the angle of acceptance of said beam at said spherical mirror.

14. The laser cavity optical system of claim 1 wherein said feedback means comprises a curved mirror with the outside surface thereof positioned to reflect said light output portion back into said laser optical cavity.

15. The laser cavity optical system of claim 1 wherein said feedback means comprises a partially reflecting, partially transmitting mirror located at said second spatial direction beam waist position.

16. The laser cavity optical system of claim 15 wherein a slit aperture is located at said second spatial direction beam waist position to limit the angle of acceptance of said beam, said mirror mounted in said aperture.

17. The laser cavity optical system of claim 15 wherein said mirror is a partially reflecting, partially transmitting wavelength selective filter.

18. The laser cavity optical system of claim 15 wherein there is means positioned at the other facet of said laser to selectively reflect from the laser emission a desired wavelength as feedback to said laser.

19. The laser cavity optical system of claim 18 wherein in said selective means comprises a grating, a prism plus plane mirror, a plane mirror, a concave mirror, a wavelength selective mirror.

20. The laser cavity optical system of claim 19 wherein in said wavelength is selected by rotation of said grating.

21. The laser cavity optical system of claim 20 wherein said selective means comprises a wavelength selective mirror.

22. The laser cavity optical system of claim 21 wherein said wavelength selective mirror is a multilayer dielectric stack.

23. The laser cavity optical system of claim 18 wherein said selective wavelength reflection means comprises a spectral filter aligned to receive said emission.

24. The laser cavity optical system of claim 18 wherein said selective wavelength reflection means comprises a GRIN rod lens aligned to receive said light output with a multilayer dielectric reflecting stack mounted on the end of said rod opposite to the end aligned to receive said output.

25. The laser cavity optical system of claim 24 wherein an AR coating is provided on said rod output receiving end.

26. The laser cavity optical of claim 24 wherein PAR coating is provided on said rod output receiving end.

27. The laser cavity optical system of claim 1 which includes spatially positioned aperture means between said feedback means and said laser.

28. The laser cavity optical system of claim 1 wherein said feedback means is angularly adjustable relative to the path of said output to provide spatial mode control.

29. The laser cavity optical system of claim 1 wherein said feedback means is laterally adjustable relative to said output to provide spatial mode control.

* * * * *